(12) United States Patent
Tanaka

(10) Patent No.: US 10,896,858 B2
(45) Date of Patent: Jan. 19, 2021

(54) PROCESSING APPARATUS AND PROCESSING METHOD

(71) Applicant: Tokyo Electron Limited, Tokyo (JP)

(72) Inventor: Keiichi Tanaka, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 181 days.

(21) Appl. No.: 16/039,569

(22) Filed: Jul. 19, 2018

(65) Prior Publication Data

US 2019/0035698 A1 Jan. 31, 2019

(30) Foreign Application Priority Data

Jul. 31, 2017 (JP) ................................. 2017-147996

(51) Int. Cl.
| | |
|---|---|
| *H01L 21/66* | (2006.01) |
| *H01L 21/311* | (2006.01) |
| *H01L 21/67* | (2006.01) |
| *H01L 21/02* | (2006.01) |
| *H01L 37/02* | (2006.01) |
| *C23C 16/00* | (2006.01) |
| *H01L 21/677* | (2006.01) |

(52) U.S. Cl.
CPC .............. *H01L 22/26* (2013.01); *C23C 16/00* (2013.01); *H01L 21/0206* (2013.01); *H01L 21/0217* (2013.01); *H01L 21/02274* (2013.01); *H01L 21/31116* (2013.01); *H01L 21/67173* (2013.01); *H01L 21/67178* (2013.01); *H01L 21/67742* (2013.01); *H01L 37/02* (2013.01)

(58) Field of Classification Search
CPC .............. H01L 22/26; H01L 21/67178; H01L 21/67742; H01L 21/31116; H01L 21/67173; H01L 21/02274; H01L 21/0206; H01L 21/0217; H01J 37/02; H01J 37/32899; H01J 37/32449; H01J 37/3244; C23C 16/00
See application file for complete search history.

(56) References Cited

U.S. PATENT DOCUMENTS

| | | | | |
|---|---|---|---|---|
| 9,447,498 | B2* | 9/2016 | Shiba | ................ C23C 16/45536 |
| 9,605,343 | B2* | 3/2017 | Winkler | ............ H01L 21/28562 |
| 2003/0092186 | A1* | 5/2003 | Pressman | ................ B65B 7/161 |
| | | | | 436/46 |

(Continued)

FOREIGN PATENT DOCUMENTS

| | | |
|---|---|---|
| JP | 07-086169 A | 3/1995 |
| JP | 2006-024638 A | 1/2006 |

(Continued)

*Primary Examiner* — John P Dulka
(74) *Attorney, Agent, or Firm* — Abelman, Frayne & Schwab

(57) ABSTRACT

Disclosed is a processing method for performing a processing corresponding to a processing gas in a plurality of processing containers which are connected to a gas supply source, and at least some of which have different lengths of pipes to the gas supply source. The processing method includes simultaneously supplying the processing gas from the gas supply source to the plurality of processing containers, and individually supplying the processing gas from the gas supply source to the plurality of processing containers or to some of the plurality of processing containers.

9 Claims, 7 Drawing Sheets

(56) References Cited

U.S. PATENT DOCUMENTS

| | | | | |
|---|---|---|---|---|
| 2015/0132212 A1* | 5/2015 | Winkler | ............... | C01B 32/16 |
| | | | | 423/447.2 |
| 2015/0267297 A1* | 9/2015 | Shiba | ............... | C23C 16/448 |
| | | | | 427/569 |
| 2015/0267299 A1* | 9/2015 | Hawkins | ............ | C23C 16/45523 |
| | | | | 427/255.28 |

FOREIGN PATENT DOCUMENTS

| JP | 2007-142018 A | 6/2007 |
|---|---|---|
| JP | 2017-014903 A | 1/2017 |

\* cited by examiner

PROCESSING APPARATUS AND PROCESSING METHOD

CROSS-REFERENCE TO RELATED APPLICATIONS

This application is based on and claims priority from Japanese Patent Application No. 2017-147996 filed on Jul. 31, 2017 with the Japan Patent Office, the disclosure of which is incorporated herein in its entirety by reference.

TECHNICAL FIELD

Various aspects and embodiments of the present disclosure relate to a processing apparatus and a processing method.

BACKGROUND

In a substrate processing apparatus that performs a substrate processing, in order to improve throughput, there is a case where a plurality of processing containers are provided to process a plurality of substrates to be processed in parallel. In this case, each processing container is supplied with a processing gas, and a processing corresponding to the supplied processing gas is performed therein. Examples of the processing corresponding to the processing gas include, for example, etching, film forming, and cleaning.

However, when a plurality of processing containers are provided in a substrate processing apparatus, a gas supply source for supplying the processing gas is provided for each processing container. Thus, the size of the substrate processing apparatus and the facility cost increase. In order to avoid this situation, it is conceivable to connect a common gas supply source to the plurality of processing containers, and individually supply a processing gas from the common gas supply source to each processing container, thereby reducing the number of the gas supply sources. See, for example, Japanese Patent Laid-Open Publication No. 07-086169.

SUMMARY

According to an aspect, the present disclosure provides a processing method for performing a processing corresponding to a processing gas in a plurality of processing containers which are connected to a gas supply source, and at least some of which have different lengths of pipes to the gas supply source. The processing method includes simultaneously supplying the processing gas from the gas supply source to the plurality of processing containers, and individually supplying the processing gas from the gas supply source to the plurality of processing containers or to some of the plurality of processing containers.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
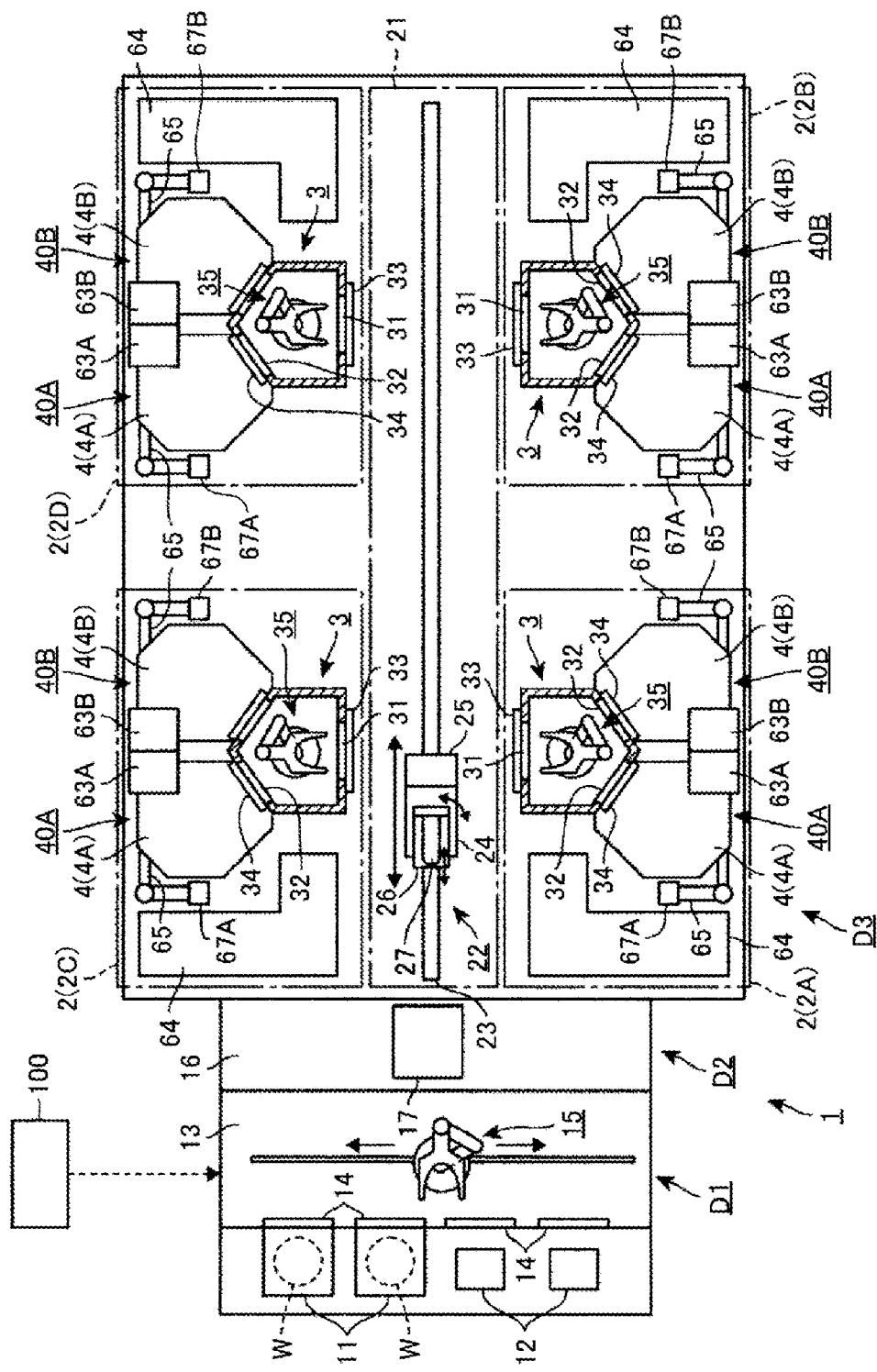
FIG. 1 is a plan view of a film forming apparatus according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a case of connecting a common gas supply source to a plurality of processing containers, from a viewpoint of layout, it is difficult to make the plurality of processing containers have the same length of the pipes to the common gas supply source. Since the uniformity of the processing gas distributed from the common gas supply source to the plurality of processing containers is impaired when the plurality of processing containers have different lengths of the pipes to the common gas supply source, there is concern that the processing result may vary among the processing containers. For example, it is assumed that the processing gas is a cleaning gas for removing a film in the processing container. In this case, the cleaning gas supplied from the common gas supply source is not evenly distributed to the plurality of processing containers. Therefore, even though the film is completely removed in a certain processing container, there is possibility that the film remains in other processing containers.

According to an aspect, the present disclosure provides a processing method for performing a processing corresponding to a processing gas in a plurality of processing containers which are connected to a gas supply source, and at least some of which have different lengths of pipes to the gas supply source. The processing method includes simultaneously supplying the processing gas from the gas supply source to the plurality of processing containers, and individually supplying the processing gas from the gas supply source to the plurality of processing containers or to some of the plurality of processing containers.

In the above-described processing method, the individually supplying of the processing gas includes sequentially supplying the processing gas to the plurality of processing containers or to some of the plurality of processing containers such that a time for supplying the processing gas to a processing container having a relatively long pipe length to the gas supply source is longer than a time for supplying the processing gas to a processing container having a relatively short pipe length to the gas supply source.

In the above-described processing method, the individually supplying of the processing gas includes sequentially supplying the processing gas to the plurality of processing containers or some of the plurality of processing containers such that a flow rate of the processing gas supplied to a processing container having a relatively long pipe length to the gas supply source is higher than a flow rate of the processing gas supplied to a processing container having a relatively short pipe length to the gas supply source.

In the above-described processing method, the processing gas is a cleaning gas for removing a film in each of the processing containers, an etching gas for etching a substrate to be processed in each of the processing containers, or a film forming gas for forming a film on a substrate to be processed in each of the processing containers.

In the above-described processing method, the processing gas is the cleaning gas. A plasma forming unit is arranged on the downstream side of the gas supply source to convert the processing gas into plasma. The simultaneously supplying of the processing gas and the individually supplying of the processing gas include supplying the processing gas converted into plasma by the plasma forming unit.

In the above-described processing method, the processing gas is the cleaning gas or the etching gas, and the processing method further includes measuring an amount of a specific component contained in a gas discharged from each of the processing containers when the processing corresponding to the processing gas is performed, and detecting a timing at which the simultaneously supplying of the processing gas is switched to the individually supplying of the processing gas or a timing at which the individually supplying of the processing gas is ended, by using the measured amount of the specific component.

In the above-described processing method, the processing gas is the film forming gas, and the processing method further includes measuring a film thickness of a film formed on a substrate to be processed in each of the processing containers when the processing corresponding to the processing gas is performed, and detecting a timing at which the simultaneously supplying of the processing gas is switched to the individually supplying of the processing gas or a timing at which the individually supplying of the processing gas is ended, by using the measured film thickness.

In the above-described processing method, the plurality of processing containers are stacked and arranged in a vertical direction.

According to another aspect, the present disclosure provides a processing apparatus includes: a gas supply source configured to supply a processing gas; a plurality of processing containers connected to the gas supply source and configured to perform a processing corresponding to the processing gas, at least some of the processing containers having different lengths of pipes to the gas supply source; and a controller configured to execute a processing method including simultaneously supplying the processing gas from the gas supply source to the plurality of processing containers, and individually supplying the processing gas from the gas supply source to the plurality of processing containers or to some of the plurality of processing containers.

According to an aspect of the processing method of the present disclosure, when a processing corresponding to a processing gas is performed in a plurality of processing containers having different lengths of pipes to a common gas supply source, it is possible to have an effect capable of suppressing variations in processing results among the processing containers.

Hereinafter, embodiments of the processing apparatus and the processing method disclosed herein will be described in detail with reference to drawings. Meanwhile, in the respective drawings, the same or corresponding parts will be denoted by the same symbols. Further, in the following, a film forming apparatus will be described as an example of the processing apparatus.

Figure 2:
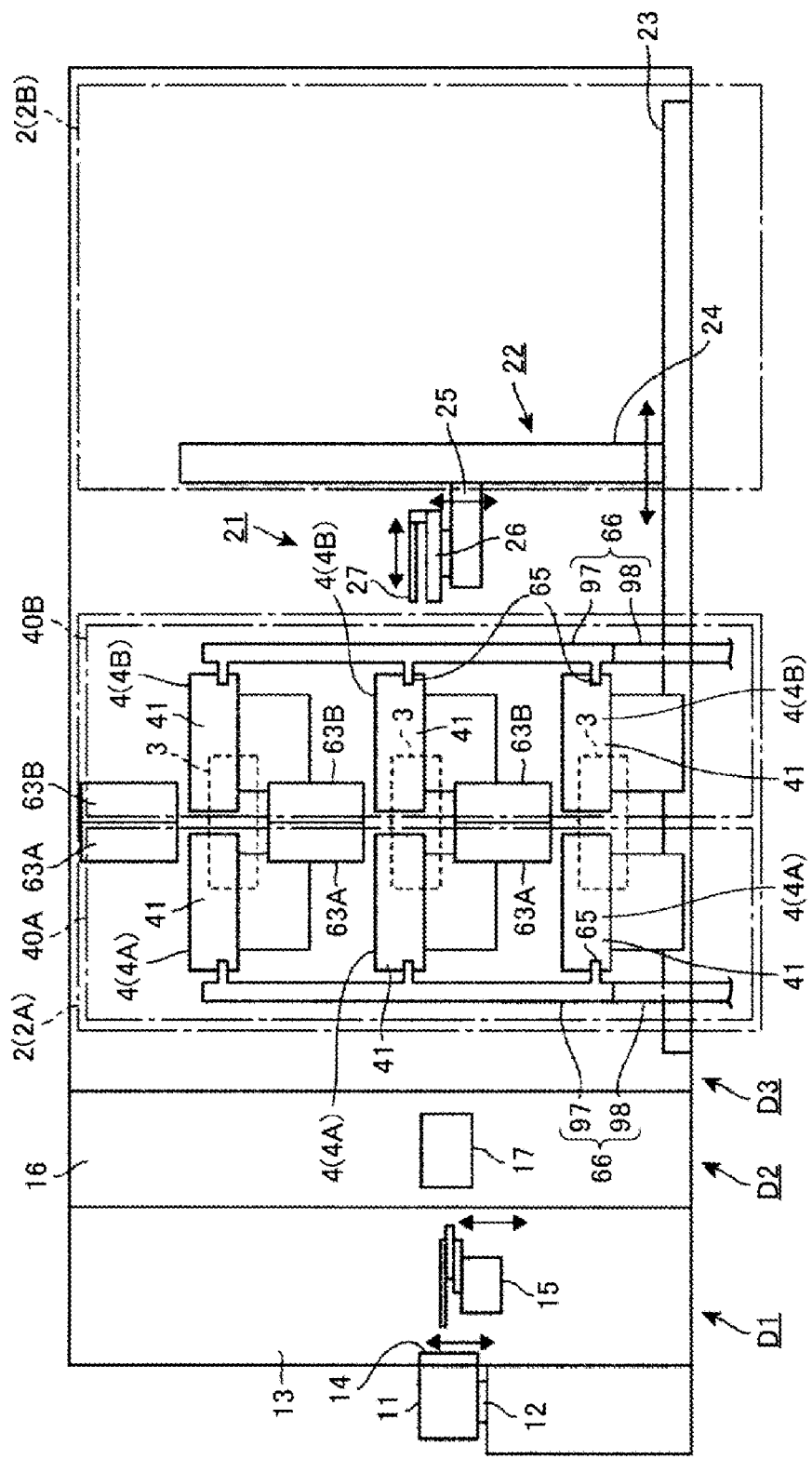
FIG. 2 is a longitudinal sectional side view of a film forming apparatus according to an embodiment.

FIG. 1 is a plan view of a film forming apparatus 1 according to an embodiment. FIG. 2 is a longitudinal sectional side view of the film forming apparatus 1 according to the embodiment. As illustrated in FIGS. 1 and 2, the film forming apparatus 1 is configured by linearly connecting a carrier block D1, a delivery block D2, and a processing block D3 in the horizontal direction. In the following description of the film forming apparatus 1, the arrangement direction of the blocks D1 to D3 is defined as the front-back direction, and the block D1 side is defined as the front side. Further, the right side and the left side in the description are the right side and the left side, respectively, when viewed from the block D1 to the block D3.

In the carrier block D1, four placing tables 12 are provided in the left-right direction and each configured to place a transfer container 11 that accommodates a plurality of wafers W. The carrier block D1 is configured as a transfer port for loading and unloading the wafer W with respect to the transfer container 11 placed on the placing table 12. On the side wall of the carrier block D1 facing the transfer container 11 placed on the placing table 12, a transfer port is formed so as to be opened to a transfer chamber 13 formed in the carrier block D1 and is configured to be freely opened and closed by an open/close door 14. The transfer chamber 13 is an air atmosphere at normal pressure, and a transfer mechanism 15 of the wafer W is provided in the transfer chamber 13. The transfer mechanism 15 is an articulated arm configured to be movable in the left-right direction and also movable up and down, and transfer the wafer W between the transfer chamber 13 and the transfer container 11.

In the delivery block D2, a transfer chamber 16 which is an air atmosphere at normal pressure is provided, and a placing portion 17 on which the wafer W is placed is provided in the transfer chamber 16. The transfer mechanism 15 in the carrier block D1 may access the placing portion 17 and deliver the wafer W thereto.

Next, the processing block D3 will be described. In the processing block D3, a transfer region 21 of the wafer W, which is an air atmosphere at normal pressure, and four wafer processing units 2 are provided. The transfer region 21 is formed so as to extend in the front-back direction at the central portion in the left-right direction of the processing block D3. A transfer mechanism 22 of the wafer W is provided in the transfer region 21. The transfer mechanism 22 delivers the wafer W between the placing portion 17 in the delivery block D2 and a loadlock module 3 described later provided in each wafer processing unit 2. The transfer mechanism 22 is constituted by a guide rail 23 extending in the front-back direction, a support column 24 that moves back and forth along the guide rail 23, a lifting table 25 that is vertically movable up and down provided in the support column 24, a rotating table 26 that is rotatable about a vertical axis on the lifting table 25, and a support portion 27 which is able to advance and retreat on the rotating table 26 and which supports the rear surface of the wafer W.

Next, the wafer processing unit 2 will be described. The wafer processing unit 2 is configured such that a SiN (silicon nitride) film is formed on a wafer W which is an example of a substrate to be processed. Two wafer processing units 2 are provided on the left and right of the transfer region 21, respectively. Two wafer processing units 2 respectively provided on the left side and the right side of the transfer region 21 are arranged along the front-back direction, and face each other across the transfer region 21. In order to distinguish the four wafer processing units 2 from each other, the four wafer processing units 2 may be denoted by 2A to 2D, respectively. Among the four wafer processing units 2, the wafer processing unit on the right-front side is denoted by 2A, the wafer processing unit on the right-back side is denoted by 2B, the wafer processing unit on the left-front side is denoted by 2C, and the wafer processing unit on the left-back side is denoted by 2D.

Figure 3:
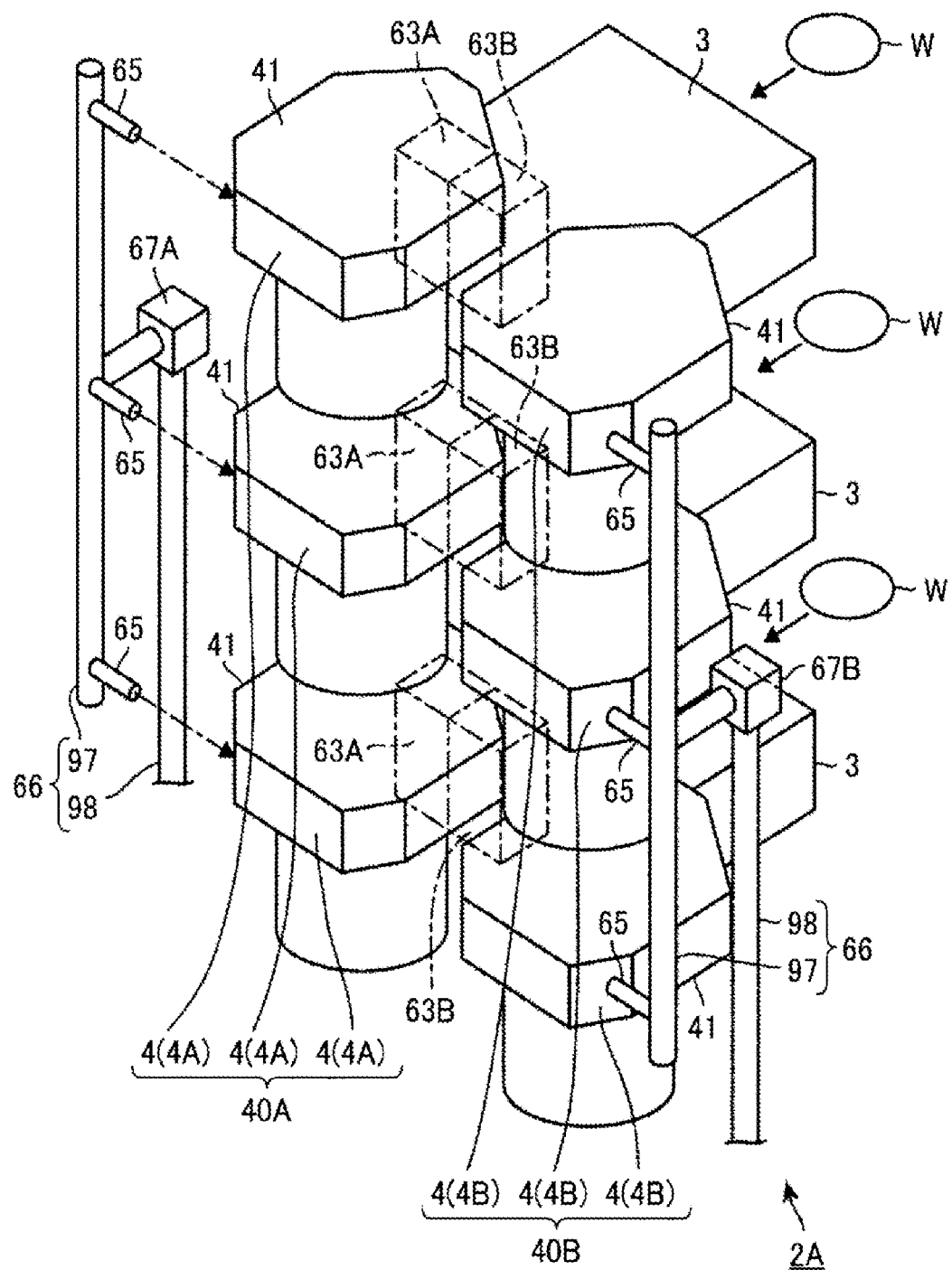
FIG. 3 is a perspective view of a wafer processing unit provided in the film forming apparatus.

Each of the wafer processing units 2A to 2D is configured in the same manner. Here, the wafer processing unit 2A will be representatively described with reference to FIG. 3 as well. FIG. 3 is a perspective view of a wafer processing unit 2A provided in the film forming apparatus 1. As illustrated in FIGS. 1 to 3, the wafer processing unit 2A includes three loadlock modules 3 and six film forming modules 4. The three loadlock modules 3 are provided so as to be arranged in a row at intervals in the vertical direction and face the transfer region 21. Further, on the side of each of the loadlock modules 3 opposite to the transfer region 21, two film forming modules 4 are arranged along the front-back direction. As a result, the six film forming modules 4 (that is, six processing containers 41) which constitute the wafer processing unit 2A are stacked in three tiers in the vertical direction, and arranged in two rows in the front-back direction.

The loadlock module 3 is formed in, for example, a substantially pentagonal shape in a plan view. One of the sides of the pentagon is arranged along the transfer region 21, and on the side wall of the loadlock module 3 which constitutes the side, a transfer port 31 of the wafer W is formed so as to be opened to the transfer region 21. A processing container 41, which constitutes the film forming module 4, is connected to each of the two sides among the sides of the pentagon which are not adjacent to the side on which the transfer port 31 is formed. A transfer port 32 of the wafer W is formed so as to be opened in the processing container 41. The transfer ports 31 and 32 of the loadlock module 3 are configured to be freely opened and closed by gate valves 33 and 34, respectively.

As described above, one loadlock module 3 is connected with two film forming modules 4 on the opposite side of the transfer region 21, and the two film forming modules 4 are arranged in the front-back direction. When the loadlock module 3 and the two film forming modules 4 connected to each other as described above are used as a processing unit, the wafer W is transferred in the processing unit and subjected to a film forming processing by the film forming apparatus 1. Therefore, the two film forming modules 4 are film forming modules 4 paired with each other in order to perform a processing on the same wafer W. Meanwhile, since the wafer processing units 2A to 2D are provided as described above, a plurality of processing units are arranged on each of the front, back, left, and right sides of the transfer region 21, and the processing units face each other across the transfer region 21 in the left-right direction.

In the loadlock module 3, an air supply port and an exhaust port (all not illustrated) are opened. Due to the supply and exhaust of the air, the interior of the loadlock module 3 is configured as a loadlock chamber capable of switching between a normal pressure atmosphere and a vacuum atmosphere. Meanwhile, the supplied gas is not limited to air, but may be, for example, an inert gas. Further, a transfer mechanism 35 of a wafer W which is an articulated arm is provided in the loadlock module 3. The transfer mechanism 35 serving as a first transfer mechanism enters into the processing containers 41 of the respective film forming modules 4 connected to the loadlock module 3 and into the transfer region 21, and delivers the wafer W between the respective film forming modules 4 and the transfer mechanism 22.

Each of the film forming modules 4 is configured in the same manner, and includes the processing container 41 that accommodates the wafer W as described above. Plasma is generated in the processing container 41 that accommodates the wafer W, and a film forming gas is supplied as a processing gas, so that a SiN film is formed on the wafer W by CVD. After this film forming processing, a cleaning gas is supplied as a processing gas so that the SiN film formed in the processing container 41 is removed and the inside of the processing container 41 is cleaned.

Among the six film forming modules 4, three film forming modules 4 stacked on the front side are collectively referred to as a film forming module group 40A, and the other three film forming modules 4 stacked on the back side are collectively referred to as a film forming module group 40B. Further, for the sake of convenience in the following description, each film forming module 4 which constitutes the film forming module group 40A may be denoted by 4A, and each film forming module 4 which constitutes the film forming module group 40B may be denoted by 4B. The processing container 41 which constitutes each film forming module 4A is a first processing container, and the processing container 41 which constitutes each film forming module 4B is a second processing container. The film forming processing and the cleaning of the SiN film are simultaneously performed among each of the film forming modules 4A which constitute the film forming module group 40A, and simultaneously performed among each of the film forming modules 4B which constitute the film forming module group 40B as well. Further, the film forming processing is performed in one of the film forming module groups 40A and 40B, and the cleaning is performed in the other of the film forming module groups 40A and 40B in parallel with the film forming processing. That is, the time period in which the film forming processing is performed and the time period in which the cleaning is performed overlap each other.

Figure 4:
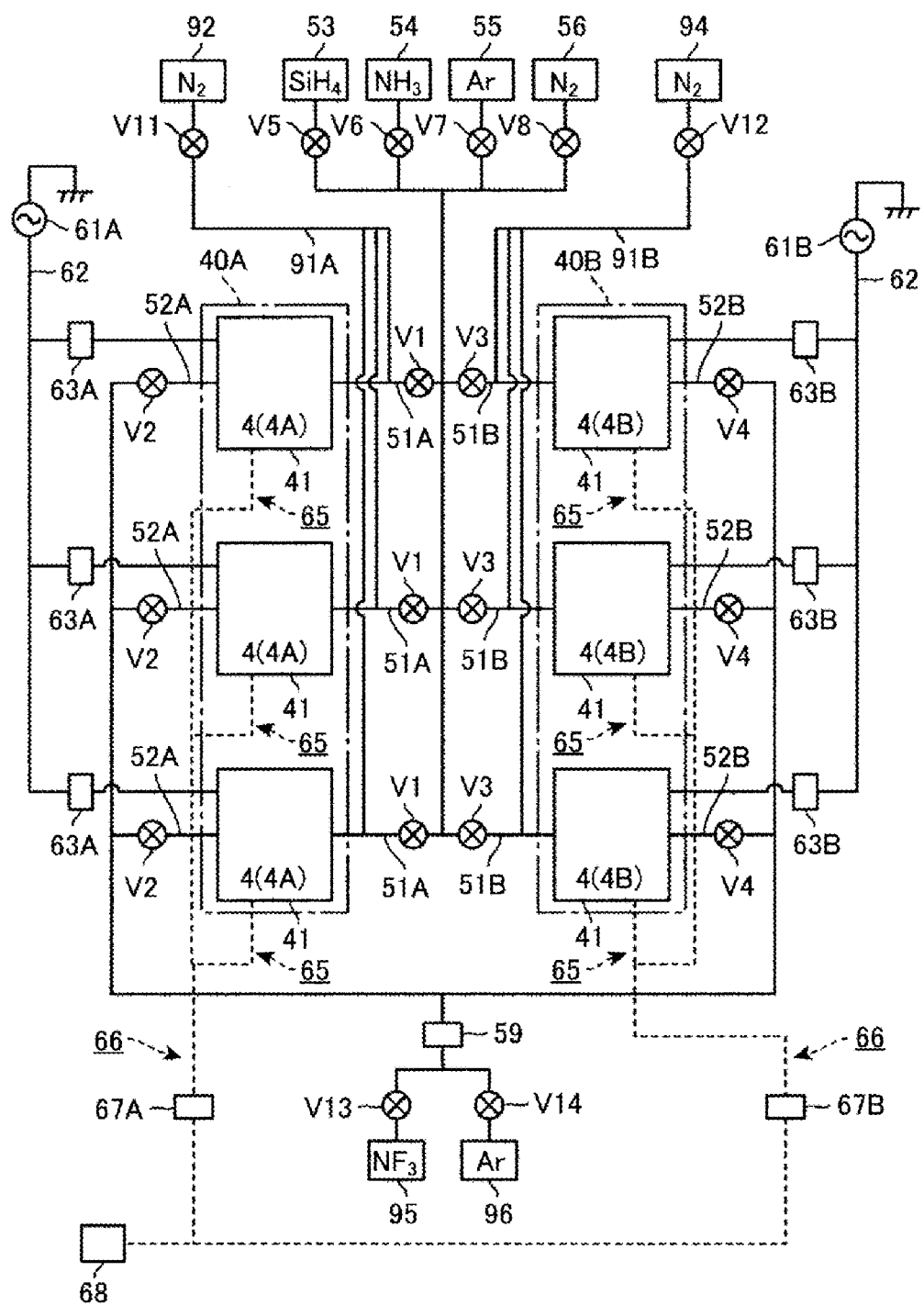
FIG. 4 is a view illustrating an example of a piping system.

Continuously, an example of a piping system formed for the film forming module groups 40A and 40B in order to perform the film forming processing and the cleaning as described above will be described with reference to FIG. 4. FIG. 4 is a view illustrating an example of a piping system. As illustrated in FIG. 4, downstream ends of gas supply pipes 51A and 52A are connected to the each of the film forming modules 4A which constitute the film forming module group 40A, and downstream ends of gas supply pipes 51B and 52B are connected to the each of the film forming modules 4B which constitute the film forming module group 40B. Valves V1, V2, V3 and V4 are interposed in the gas supply pipes 51A, 52A, 51B, and 52B, respectively.

The upstream sides of the gas supply pipes 51A and 51B are merged to form a confluence pipe, and the upstream side of the confluence pipe is branched into four branches to constitute branch pipes. The upstream sides of the branch pipes are connected to a $SiH_4$ (monosilane) gas supply source 53, an $NH_3$ (ammonia) gas supply source 54, an Ar (argon) gas supply source 55, and a $N_2$ (nitrogen) gas supply source 56 via valves V5 to V8, respectively. The $SiH_4$ gas and the $NH_3$ gas are processing gases for forming the SiN film (i.e., film forming gases). The Ar gas is a gas for plasma generation, and the $N_2$ gas is a carrier gas for the processing gas. The valves V5 to V8 and the gas supply sources 53 to 56 constitute a first gas supply mechanism and a second gas supply mechanism which are film forming gas supply mechanisms. The film forming gas supply mechanisms may independently supply a gas to the film forming module groups 40A and 40B by opening and closing the respective valves V.

Further, in each of the gas supply pipes 51A, the downstream end of a gas supply pipe 91A is connected to the downstream side of the valve V1, and the upstream end of the gas supply pipe 91A is connected to a $N_2$ gas supply source 92 via a valve V11. Further, in each of the gas supply pipes 51B, the downstream end of a gas supply pipe 91B is connected to the downstream side of the valve V3, and the upstream end of the gas supply pipe 91B is connected to a $N_2$ gas supply source 94 via a valve V12. The $N_2$ gas supplied from the $N_2$ gas supply sources 92 and 94 is a purge gas for purging the inside of each processing container 41 of the film forming module group 40A and the inside of each processing container 41 of the film forming module group 40B.

Further, the upstream sides of the gas supply pipes 52A and 52B are merged to form a confluence pipe, and the upstream side of the confluence pipe is branched into two branches via a remote plasma forming unit 59 to constitute branch pipes. The upstream sides of the branch pipes are connected to a $NF_3$ (nitrogen trifluoride) gas supply source 95 and an Ar gas supply source 96 via valves V13 and V14, respectively. That is, the three processing containers 41 of the film forming module group 40A and the three processing containers 41 of the film forming module group 40B are connected to the gas supply sources 95 and 96, respectively, which are common gas supply sources. At least some of the three processing containers 41 of the film forming module group 40A and the three processing containers 41 of the film forming module group 40B have different lengths of pipes to the gas supply sources 95 and 96. The length of pipes to each of the gas supply sources 95 and 96 is the sum of the lengths of each of the gas supply pipes 52A and 52B, the lengths of portions corresponding to each of the gas supply pipes 52A and 52B in the confluence pipe, and the lengths of the branch pipes. The $NF_3$ gas supplied from the gas supply source 95 is a processing gas for removing a film inside the processing container 41 (i.e., a cleaning gas), and the Ar gas supplied from the gas supply source 96 is a gas for plasma generation. The remote plasma forming unit 59 is disposed on the downstream side of the gas supply sources 95 and 96 and excites the $NF_3$ gas and the Ar gas to convert into plasma, and supplies the $NF_3$ gas and Ar gas, which have been converted into plasma, to the downstream side as remote plasma. The gas supply sources 95 and 96, the remote plasma forming unit 59, and the valves V13 and V14 constitute a cleaning gas supply mechanism. By opening and closing the respective valves V, the cleaning gas supply mechanism may independently supply a gas to the film forming module groups 40A and 40B.

Further, the film forming module groups 40A and 40B are provided with grounded high frequency power sources 61A and 61B, respectively. The high frequency power sources 61A and 61B are respectively connected to each of the film forming modules 4A of the film forming module group 40A and each of the film forming modules 4B of the film forming module group 40B via high frequency supply lines 62 respectively branched from the high frequency power sources 61A and 61B. A matching unit is interposed in each branched supply line 62. The matching unit interposed in the supply line 62 branched from the high frequency power source 61A is denoted by 63A, the matching unit interposed in the supply line 62 branched from the high frequency power source 61B is denoted by 63B.

As illustrated in FIGS. 2 and 3, the above-described matching units 63A and 63B are, for example, provided on the central portion in the front and the back of each row formed by the film forming modules 4A and 4B connected to the same loadlock module 3, and disposed in the vicinity of the corresponding film forming modules 4A and 4B. That is, the matching units 63A and 63B are arranged vertically in three tiers. Further, the high frequency power sources 61A and 61B, the remote plasma forming unit 59, respective gas supply sources, and respective valves V are provided, for example, in the device installation region 64 on the lateral side of the loadlock module 3 and the film forming module 4 illustrated in FIG. 1. The illustration of the device installation region 64 is omitted in the drawings other than FIG. 1.

Returning to FIG. 4 and continuing the explanation, the upstream ends of exhaust pipes 65 for exhausting the inside of the processing containers 41 are connected to the film forming modules 4A and 4B, respectively. The downstream side of each of the exhaust pipes 65 connected to the film forming modules 4A and the downstream side of each of the exhaust pipes 65 connected to the film forming modules 4B are merged with each other to form common exhaust pipes 66. A pressure adjusting unit, which includes, for example, a valve, is interposed in each common exhaust pipe 66 to adjust the pressure in the processing container 41 by adjusting the exhaust flow rate. The pressure adjusting unit interposed in the common exhaust pipe 66 connected to the film forming module 4A is denoted by 67A, and the pressure adjusting unit interposed in the common exhaust pipe 66 connected to the film forming module 4B is denoted by 67B. The common exhaust pipes 66 are merged with each other on the downstream side of the pressure adjusting units 67A and 67B, and connected to an exhaust mechanism 68 constituted by, for example, a vacuum pump.

The exhaust pipes 65 and the common exhaust pipes 66 will be further described. As illustrated in FIGS. 2 and 3, each exhaust pipe 65 is provided so as to be drawn out in the lateral direction from the processing container 41 of each film forming module 4. Each common exhaust pipe 66 includes a connecting pipe 97 and a main pipe 98. Each connecting pipe 97 extends in the vertical direction such that the respective exhaust pipes 65 of the stacked film forming modules 4A and the respective exhaust pipes 65 of the stacked film forming modules 4B are connected. That is, each connecting pipe 97 extends along the arrangement direction of the film forming module 4. The main pipe 98 is drawn out in the lateral direction from the central portion in the longitudinal direction of the connecting pipe 97, is then bent, and extends downward. The pressure adjusting units 67A and 67B are provided in the main pipe 98. As described above, the common exhaust pipes 66 are formed so as to be drawn around in the vertical direction.

Figure 5:
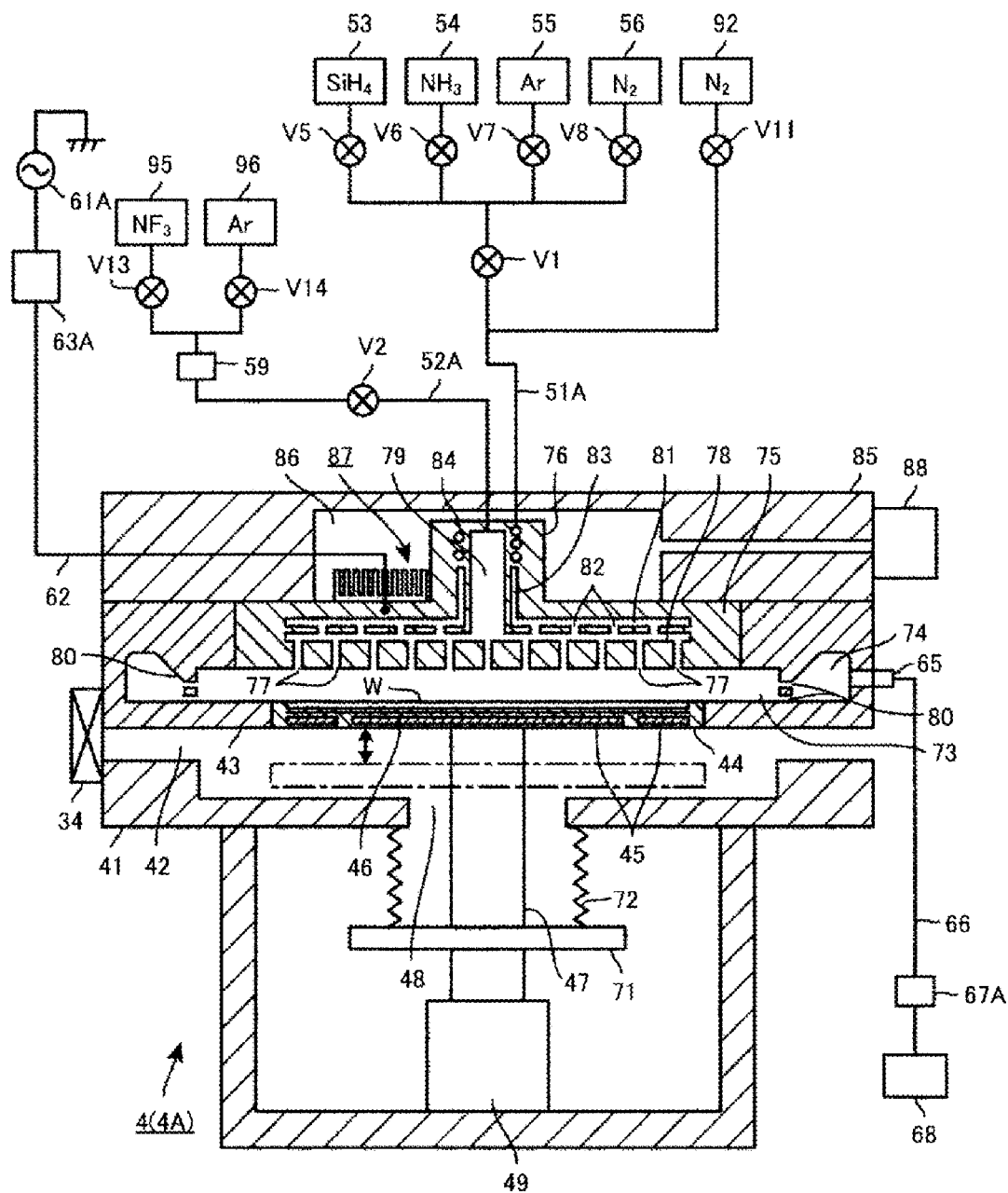
FIG. 5 is a longitudinal sectional side view of a film forming module that constitutes a wafer processing unit.

Continuously, the configuration of the film forming module 4 will be described with reference to the longitudinal sectional side view of FIG. 5. FIG. 5 is a longitudinal sectional side view of the film forming module 4 which constitutes a wafer processing unit 2. Since the six film forming modules 4 are configured similarly to each other as described above, one film forming module 4A is representatively illustrated in FIG. 5. Reference number 42 in the drawing denotes a transfer port of the wafer W which is opened on a side wall of the processing container 41 and configured to be opened and closed by the gate valve 34 described above. Reference number 43 in the drawing denotes a ring-shaped protrusion formed such that an inner side wall of the processing container 41 on the upper side of the transfer port 42 protrudes inward.

A horizontal placing table 44 of the wafer W is provided in the processing container 41. The placing table 44 includes therein heaters 45 that independently heat the central portion and the peripheral portion of the wafer W and an electrode 46 that forms a capacitively coupled plasma together with a gas shower head 75 to be described later. Reference number 47 in the drawing denotes a support portion that supports the placing table 44 from the lower side. The support portion, extends downward through an opening portion 48 on the lower side of the processing container 41, and is connected to a lifting mechanism 49. Reference number 71 in the drawing denotes a flange provided in the support portion 47 below the opening portion 48. Reference number 72 in the drawing denotes an extensible bellows, which is connected to the flange 71 and an edge portion of the opening portion 48 so as to keep the inside of the processing chamber 41 airtight.

By the lifting mechanism 49, the placing table 44 is movable up and down between a delivery position (indicated by a chain line in the drawing) of the wafer W below the protrusion 43 and a processing position (indicated by a solid line in the drawing) of the upper side surrounded by the protrusion 43. The wafer W is delivered between the placing table 44 at the delivery position and the transfer mechanism 35 of the loadlock module 3 described above which has entered the processing container 41 through the transfer port 42. The delivery is performed through liftable support pins of the wafer W which protrude from and recede into the surface of the placing table 44, but illustration of the support pins is omitted.

When the placing table 44 is moved to the processing position, a flat circular processing space 73 is defined, which is surrounded by the placing table 44, a ceiling portion of the processing container 41, the side wall of the processing container 41, and the protrusion 43. Reference number 74 in the drawing denotes a ring-shaped exhaust space defined in the side wall of the processing container 41 so as to surround the processing space 73. In the side wall of the processing container 41, a plurality of exhaust ports 80 opened to the processing space 73 and connected to the exhaust space 74 are formed. The exhaust pipe 65 is connected to the exhaust space 74 from the outside of the processing container 41 so that the processing space 73 may be evacuated.

Reference number 75 in the drawing denotes a gas shower head which constitutes the ceiling portion of the processing container 41 and faces the placing table 44. The central upper portion of the gas shower head 75 rises to form a flow path forming portion 76. Reference number 77 in the drawing denotes a gas ejection port pierced through the lower surface of the gas shower head 75 and connected with a flat gas diffusion chamber 78 formed in the gas shower head 75. The central portion of the gas diffusion chamber 78 is drawn upward in the flow path forming portion 76 to form a gas introduction path 79. The gas supply pipe 52A described above is connected to the upstream side of the gas introduction path 79. Therefore, the $NF_3$ gas and the Ar gas converted into plasma by the remote plasma forming unit 59 may be ejected from the gas ejection port 77 via the gas introduction path 79 and the gas diffusion chamber 78.

Reference number 81 in the drawing denotes a flat gas diffusion chamber provided to be superposed above the gas diffusion chamber 78 in the gas shower head 75. Reference number 82 in the drawing denotes a plurality of communicating paths dispersed to connect the gas diffusion chambers 81 and 78. Reference number 83 in the drawing denotes a vertical gas flow path formed in such a manner that an inner edge portion of the gas diffusion chamber 81 is drawn upward in the flow path forming portion 76 to surround the gas introduction path 79. Reference number 84 in the drawing denotes a spiral gas introduction path formed on the upstream side of the vertical gas flow path 83 and formed to surround the upper portion of the gas introduction path 79. The above-described gas supply pipe 51A is connected to the upstream side of the gas introduction path 84. Therefore, the respective gases supplied from gas supply sources 53 to 56 and 92 are ejected from the gas ejection port 77 via gas introduction path 84 and the gas diffusion chambers 81 and 78.

Reference number 85 in the drawing denotes a cover member which surrounds the above-described flow path forming portion 76 and forms an upper space 86 defined above the gas shower head 75. The above-described high frequency supply line 62 is connected to the gas shower head 75. That is, the gas shower head 75 is configured as an electrode and forms a capacitively coupled plasma in the processing space 73 together with the placing table 44. The supply line 62 penetrates the cover member 85 from the lateral direction and is connected to the gas shower head 75 in the upper space 86. When the supply line 62 is formed to extend in the lateral direction in this manner, the height required for stacking the film forming modules 4 is suppressed so that the film forming apparatus is prevented from becoming larger.

Further, in the upper space 86, a heat sink 87 is provided on the gas shower head 75. Reference number 88 in the drawing denotes a fan mechanism provided outside the upper space 86 in the cover member 85 and configured to blow air to the heat sink 87 via an air blow path formed in the cover member 85, thereby suppressing the temperature of the gas shower head 75. Thus, in the stacked film forming modules 4, it is possible to suppress the influence of the heat of the gas shower head 75 of the lower film forming module 4 on the processing of the wafer W of the upper film forming module 4. Meanwhile, a pipe may be drawn around the gas shower head 75 and a cooling fluid (e.g., water) may be circulated through the pipe to cool the gas shower head 75.

The piping system illustrated in FIG. 5 illustrates a part of the piping system illustrated in FIG. 4 involved in the gas processing of the film forming module 4A. Therefore, the valve V3 which controls supply and suspension of the respective gases from the gas supply sources 53 to 56 to film forming module 4B, the gas supply source 94, and the valve V12 which controls supply and suspension of $N_2$ gas (purge gas) from the gas supply source 94 to the film forming module 4B are not illustrated. The valves V3 and V12 correspond to the valves V1 and V11 in FIG. 5, respectively, and the gas supply source 94 corresponds to the gas supply source 92 in FIG. 5. That is, in the piping system, a part involved in the gas processing of the film forming module 4B may be expressed as a configuration substantially similar to the part involved in the gas processing of the film forming module 4B illustrated in FIG. 5. However, as differences from FIG. 5, the valves V3 and V12 are provided instead of the valves V1 and V11, and the gas supply source 94 is provided instead of the gas supply source 92.

A controller 100 which is a computer as illustrated in FIG. 1 is provided in the film forming apparatus 1. The controller 100 has a program storage unit (not illustrated). The program storage unit stores programs in which commands (steps) are organized so as to perform various processes by the film forming apparatus 1. Specifically, respective operations, for example, operations of the respective transfer mechanisms 15, 22, and 35, opening and closing of the gate valves 33 and 34, opening and closing of the respective valves V, switching between on and off of the high frequency power sources 61A and 61B, forming of the remote plasma by the remote plasma forming unit 59, lifting of the placing table 44 by the lifting mechanism 49, adjusting of the temperature of the wafer W by the heater 45, pressure adjusting in the respective processing containers 41 by the pressure adjusting units 67A and 67B are controlled by outputting a control signal from the controller 100 to each part of the film forming apparatus 1. Meanwhile, the above-described programs are stored in the program storage unit in a state of being stored in a storage medium such as, for example, a hard disk, a compact disk, a magneto optical disk, or a memory card.

By the way, as described above, in the film forming apparatus 1, the film forming processing on the wafer W is performed simultaneously among respective film forming modules 4A which constitute the film forming module group 40A. At this time, however, the SiN film as a reaction product resulting from the film forming gas adheres to the wall surface in the processing container 41. The adhering SiN film causes contamination of the wafer W in subsequent processings. Therefore, in the film forming apparatus 1, the following cleaning processing is performed in order to remove the SiN film adhering to the wall surface in the processing chamber 41. For example, the controller 100 performs a cleaning processing by simultaneously supplying $NF_3$ gas and Ar gas from the gas supply sources 95 and 96 to three processing containers 41 of the film forming module group 40A, and then individually supplying $NF_3$ gas and Ar gas from the gas supply sources 95 and 96 to some of the three processing containers 41.

Figure 6:
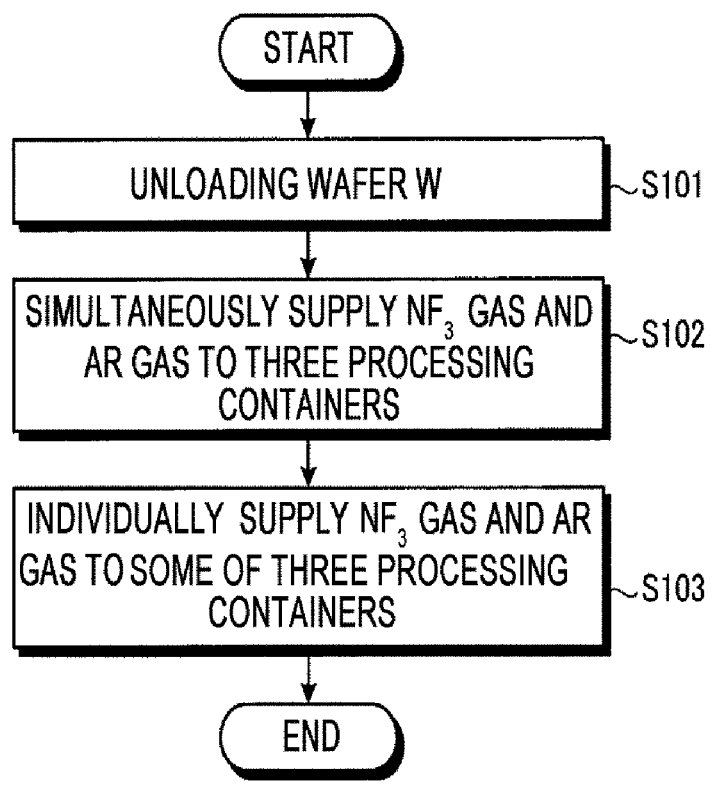
FIG. 6 is a flowchart illustrating an example of flow of a cleaning processing according to an embodiment.

FIG. 6 is a flowchart illustrating an example of flow of cleaning processing according to an embodiment. In FIG. 6, descriptions will be made on an example in which a cleaning processing is performed in three processing containers of the film forming module group 40A (hereinafter, properly abbreviated as "three processing containers 41").

After performing the film forming processing which forms the SiN film on the wafer W in the three processing containers 41, the controller 100 unloads the wafer W on which the SiN film is formed from each of the three processing containers 41 (S101).

Next, the controller performs a first gas supply step of simultaneously supplying the $NF_3$ gas and the Ar gas from the gas supply sources 95 and 96 to the three processing containers 41 (S102). Specifically, the controller 100 opens the valves V13 and V14 and the three valves V2 corresponding to the three processing containers 41 and simultaneously supplies the $NF_3$ gas and the Ar gas, which have been converted into plasma by the remote plasma forming unit 59, to the three processing containers 41. As a result, due to the $NF_3$ gas and the Ar gas converted into plasma, the SiN film adhering to the wall surface in the respective processing containers 41 during the film forming processing is removed. Meanwhile, as described above, since at least some of the three processing containers 41 have different lengths of pipes to the gas supply sources 95 and 96, the $NF_3$ gas and the Ar gas are not evenly distributed from the gas supply sources 95 and 96 to the three processing containers 41. Therefore, the film thickness of the SiN film remaining in the processing containers 41 varies among the processing containers 41.

Next, the controller performs a second gas supply step of individually supplying the $NF_3$ gas and the Ar gas from the gas supply sources 95 and 96 to some of the three processing containers 41 (S103). Specifically, the controller 100 opens some of the three valves V2 corresponding to the three processing containers 41 and closes the remaining valves V2, and individually supplies the $NF_3$ gas and the Ar gas, which have been converted into plasma by the remote plasma forming unit 59, to some of the three processing containers 41. Thus, the uniformity of the $NF_3$ gas and the Ar gas distributed from the gas supply sources 95 and 96 to the three processing containers 41 is improved, and as a result, the SiN film remaining in the processing containers 41 is evenly removed among the processing containers 41.

Figure 7:
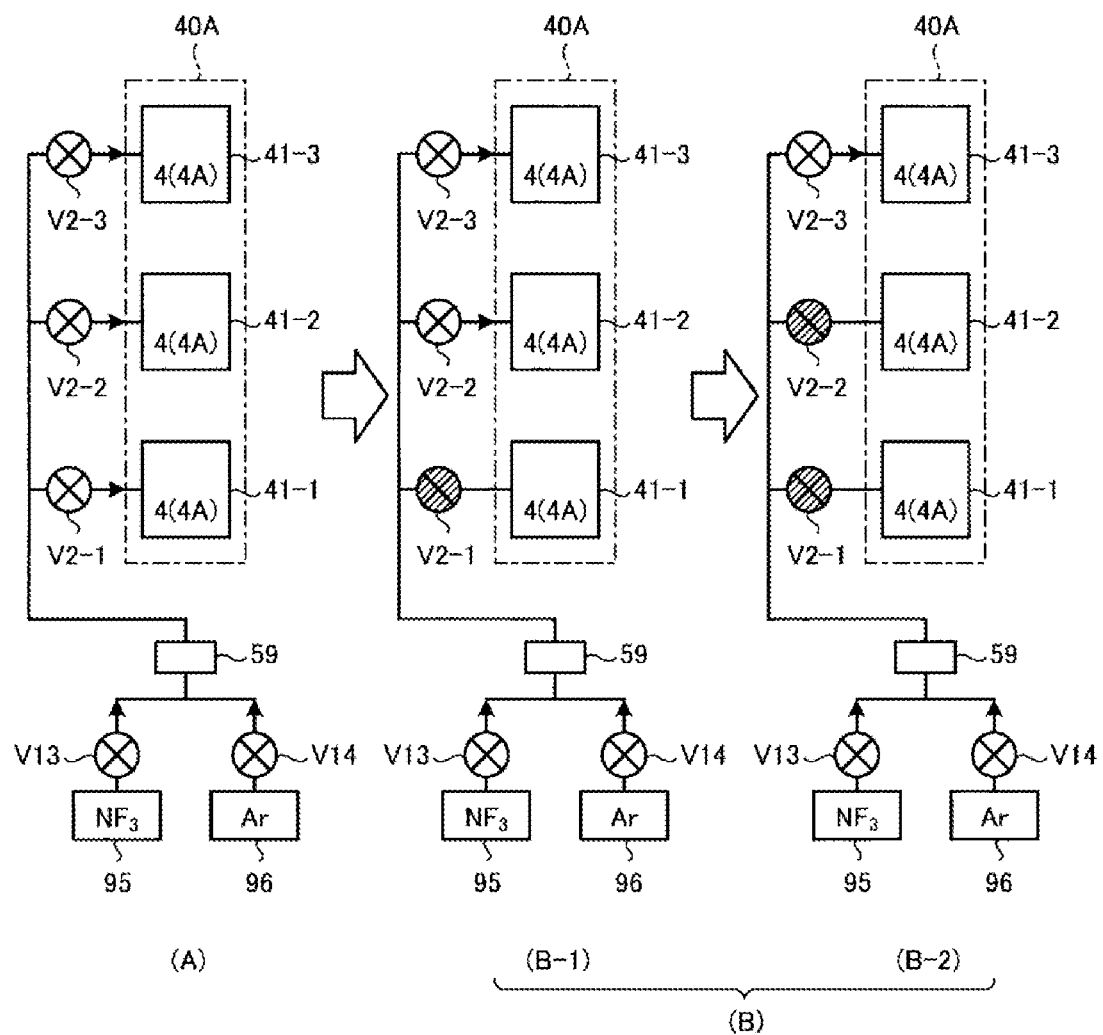
FIG. 7 is a view illustrating a specific example of the cleaning processing according to the embodiment.

Next, a specific example of the above-described cleaning processing will be described with reference to FIG. 7. FIG. 7 is a view illustrating a specific example of cleaning processing according to an embodiment. In FIG. 7, the hatched valves denote closed valves and the unhatched valves denote opened valves. Further, in FIG. 7, arrows are attached to the pipes through which the gas is circulated. Further, in FIG. 7, it is assumed that the three processing containers 41 of the film forming module group 40A have different pipe lengths to the gas supply sources 95 and 96. Here, for convenience of explanation, the three processing containers 41 are sequentially referred to as "processing container 41-1," "processing container 41-2," and "processing container 41-3" from the processing container having the shortest pipe length to the gas supply sources 95 and 96. Further, for convenience of explanation, the valve V2 corresponding to the processing container 41-1 is referred to as "valve V2-1," the valve V2 corresponding to the processing container 41-2 is referred to as "valve V2-2," and the valve V2 corresponding to the processing container 41-3 is referred to as "valve V2-3."

As illustrated in (A) in FIG. 7, when the wafer W on which the SiN film is formed is unloaded from each of the processing containers 41-1, 41-2, and 41-3, the valves V13 and V14 and the valves V2-1, V2-2, and V2-3 are opened. As a result, the $NF_3$ gas and the Ar gas, which have been converted into plasma by the remote plasma forming unit 59, are simultaneously supplied to the processing containers 41-1, 41-2, and 41-3. As a result, due to the $NF_3$ gas and the Ar gas converted into plasma, the SiN film adhering to the wall surface in the respective processing containers 41-1, 41-2, and 41-3 during the film forming processing is removed. Here, it is assumed that the SiN film adhering to the wall surface in the processing container 41-1 having the shortest pipe length to the gas supply sources 95 and 96 is completely removed.

However, since the processing containers 41-1, 41-2, and 41-3 have different pipe lengths to the gas supply sources 95 and 96, the $NF_3$ gas and the Ar gas are not evenly distributed from the gas supply sources 95 and 96 to the processing containers 41-1, 41-2, and 41-3. Therefore, even when the SiN film adhering to the wall surface in the processing container 41-1 having the shortest pipe length to the gas supply sources 95 and 96 is completely removed, the SiN film adhering to the inner surface inside the processing containers 41-2 and 41-3 is not completely removed but remains. Meanwhile, (A) in FIG. 7 corresponds to the first gas supply step described above.

Subsequently, as illustrated in (B) in FIG. 7, some valves of the valves V2-1, V2-2, and V2-3 are opened, and the remaining valves are closed. As a result, the $NF_3$ gas and the Ar gas converted into plasma by the remote plasma forming unit 59 are individually supplied to some of the processing containers 41-1, 41-2, and 41-3. That is, in the present embodiment, as illustrated in (B-1) in FIG. 7, the valves V2-2 and V2-3 are opened and the valve V2-1 is closed, so that the $NF_3$ gas and the Ar gas converted into plasma are supplied to the processing containers 41-2 and 41-3. As a result, due to the $NF_3$ gas and the Ar gas converted into plasma, the SiN film remaining in the processing containers 41-2 and 41-3 is removed. Here, it is assumed that the SiN film remaining in the processing container 41-2 having a relatively short pipe length to the gas supply sources 95 and 96 is completely removed.

Meanwhile, since the processing containers 41-2 and 41-3 have different pipe lengths to the gas supply sources 95 and 96, the $NF_3$ gas and the Ar gas are not evenly distributed from the gas supply sources 95 and 96 to the processing containers 41-2 and 41-3. Therefore, even when the SiN film remaining in the processing container 41-2 having a relatively short pipe length to the gas supply sources 95 and 96 is completely removed, the SiN film adhering to the inner surface inside the processing container 41-3 is not completely removed but remains. In this regard, in the present embodiment, as illustrated in (B-2) in FIG. 7, the valve V2-3 is opened and the valves V2-1 and V2-2 are closed, so that the $NF_3$ gas and the Ar gas converted into plasma are supplied to the processing container 41-3. As a result, due to the $NF_3$ gas and the Ar gas converted into plasma, the SiN film remaining in the processing container 41-3 is removed. Meanwhile, (B) in FIG. 7 corresponds to the second gas supply step described above.

As described above, in the second gas supply step, the processing gas is sequentially supplied to some of the processing containers 41 such that the time period in which the processing gas (the $NF_3$ gas and the Ar gas) is supplied to the processing container having a relatively long pipe length to the gas supply sources 95 and 96 becomes longer than the time period in which the processing gas is supplied to the processing container having a relatively short pipe length. Thus, the uniformity of the processing gas distributed from the gas supply sources 95 and 96 to the three processing containers 41, and as a result, the SiN film remaining in the processing containers 41 is evenly removed among the processing containers 41.

As described above, according to the cleaning processing of an embodiment, the cleaning gas is simultaneously supplied from the gas supply sources 95 and 96 to three processing containers 41 of the film forming module group 40A, and then the cleaning gas is individually supplied from the gas supply sources 95 and 96 to some of the three processing containers 41. Therefore, it is possible to improve the uniformity of the cleaning gas distributed to the three processing containers 41 having different lengths of pipes to the gas supply sources 95 and 96. As a result, it is possible to remove the SiN film in all the processing containers 41 by suppressing the variation in processing results among the processing containers 41.

Other Embodiment

The present disclosure is not limited to the above-described embodiment, and various modifications may be made within the scope of the disclosure.

For example, in the above-described embodiment, descriptions have been made on an example in which the cleaning processing is performed as a processing corresponding to the processing gas in the three processing containers 41 of the film forming module group 40A, but the processing performed in the three processing containers 41 is not limited thereto. For example, an etching processing or a film forming processing may be performed in the three processing containers 41 of the film forming module group 40A. When the etching processing is performed in the three processing containers 41 of the film forming module group 40A, an etching gas for etching the wafer W in each of the processing containers 41 is used as a processing gas. Further, when the film forming processing is performed in the three processing containers 41 of the film forming module group 40A, a film forming gas for forming a film on the wafer W in each of the processing containers 41 is used as a processing gas.

Here, when the film forming processing that forms the SiN film on the wafer W in the three processing containers 41 of the film forming module group 40A, the film forming apparatus 1 performs, for example, the following operations. That is, the film forming apparatus 1 performs a first gas supply step of simultaneously supplying the $SiH_4$ gas, the $NF_3$ gas, the Ar gas, the $N_2$ gas from the gas supply sources 53 and 56 to the three processing containers 41 of the film forming module group 40A. Next, the film forming apparatus 1 perform a second gas supply step of individually supplying the $NF_3$ gas and the Ar gas from the gas supply sources 53 and 56 to some of the three processing containers 41 (S103). Therefore, the uniformity of the film forming gases ($SiH_4$ gas and the $NF_3$ gas) distributed to the three processing containers 41 having different lengths of pipes to the gas supply sources 53 to 56, and as a result, variations in a film forming rate of SiN film among the gas processing containers 41 may be suppressed.

Further, when the processing gas is a cleaning gas or an etching gas, a timing at which the first gas supply step is switched to the second gas supply step or a timing at which the second gas supply step ends may be detected as follows. That is, the processing apparatus measures an amount of a specific component contained in the gas discharged from each processing container 41 when the cleaning processing corresponding to the cleaning gas or the etching processing corresponding to the etching gas. The measurement of the amount of the specific component contained in the gas discharged from each processing container 41 is performed, for example, by using a gas analyzer provided in the exhaust pipe 65 corresponding to each processing container 41. Examples of the gas analyzer include a mass spectrometer, an infrared spectrometer, gas chromatography, and a constant potential electrolytic gas sensor. Then, the processing apparatus detects a timing at which the first gas supply step is switched to the second gas supply step or a timing at which the second gas supply step ends, using the measured specific component amount. For example, the processing apparatus detects a timing at which the amount of the specific component becomes equal to or less than a predetermined amount as the timing at which the first gas supply step is switched to the second gas supply step or the timing at which the second gas supply step ends.

Further, when the processing gas is a film forming gas, the timing at which the first gas supply step is switched to the second gas supply step or the timing at which the second gas supply step ends may be detected as follows. That is, when the film forming processing corresponding to the film forming gas is performed, the film forming apparatus 1 measures a thickness of the film formed on the wafer W in each processing container 41. The measurement of the thickness of the film formed on the wafer W in each processing container 41 is performed, for example, by using a film thickness measuring device provided in each processing container 41. The film thickness measuring device is disclosed in, for example, Japanese Patent Laid-Open Publication No. 2010-206026. The film forming apparatus 1 detects the timing at which the first gas supply step is switched to the second gas supply step or the timing at which the second gas supply step ends, using the measured film thickness. For example, the film forming apparatus 1 detects the timing at which the film thickness becomes equal to or less than the predetermined film thickness as the timing at which the first gas supply step is switched to the second gas supply step or the timing at which the second gas supply step ends using the measured film thickness.

Further, in the above-described embodiment, in the second gas supply step, an example is illustrated in which the processing gas is sequentially supplied to some of the processing containers 41 such that the time while the processing gas (the $NF_3$ gas and the Ar gas) is supplied to the processing container having a relatively long pipe length to the gas supply sources 95 and 96 becomes longer than the time while the processing gas is supplied to the processing container having a relatively short pipe length. However, the disclosed technique is not limited thereto. For example, in the second gas supply step, the processing gas may be sequentially supplied to some of the processing containers 41 such that the flow rate of the processing gas (the $NF_3$ gas and the Ar gas) supplied to the processing container having a relatively long pipe length to the gas supply sources 95 and 96 becomes larger than the flow rate of the processing gas supplied to the processing container having a relatively short pipe length.

Further, in the above-described embodiment, an example in which the temperature is not particularly changed when the first gas supply step is switched to the second gas supply step is illustrated, but the disclosed technique is not limited thereto. For example, the second gas supply step may be performed at a lower temperature than that of the first gas supply step. Therefore, damage given to the members in the processing containers 41 from the processing gas ($NF_3$ gas and Ar gas) converted into plasma by the remote plasma forming unit 59 may be reduced.

Further, in the above-described embodiment, descriptions have been made on an example in which the voltage of the remote plasma forming unit 59 is not particularly changed when the first gas supply step is switched to the second gas supply step, but the disclosed technique is not limited thereto. For example, the second gas supply step may be performed at a lower voltage of the remote plasma forming unit than that of the first gas supply step. Therefore, damage given to the members in the processing containers 41 from the processing gas ($NF_3$ gas and Ar gas) converted into plasma by the remote plasma forming unit 59 may be reduced. Meanwhile, the voltage of the remote plasma forming unit 59 is a voltage used to convert the processing gas ($NF_3$ gas and Ar gas) into the plasma.

Further, descriptions have been made on an example in which the cleaning gas is individually supplied to some of the three processing containers 41 from the gas supply sources 95 and 96, but the disclosed technology is not limited thereto. For example, in the second gas supply step, the cleaning gas may be individually supplied to the three processing containers 41 from the gas supply sources 95 and 96.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing method for performing a processing corresponding to a processing gas in a plurality of processing containers which are connected to a gas supply source, and at least some of which have different lengths of pipes to the gas supply source, the processing method comprising:

simultaneously supplying the processing gas from the gas supply source to the plurality of processing containers; and individually supplying the processing gas from the gas supply source to the plurality of processing containers or to some of the plurality of processing containers.

2. The processing method of claim 1, wherein the individually supplying of the processing gas includes sequentially supplying the processing gas to the plurality of processing containers or some of the plurality of processing containers such that a time for supplying the processing gas to a processing container having a relatively long pipe length to the gas supply source is longer than a time for supplying the processing gas to a processing container having a relatively short pipe length to the gas supply source.

3. The processing method of claim 1, wherein the individually supplying of the processing gas includes sequentially supplying the processing gas to the plurality of processing containers or some of the plurality of processing containers such that a flow rate of the processing gas supplied to a processing container having a relatively long pipe length to the gas supply source is higher than a flow rate of the processing gas supplied to a processing container having a relatively short pipe length to the gas supply source.

4. The processing method of claim 1, wherein the processing gas is a cleaning gas for removing a film in each of the processing containers, an etching gas for etching a substrate to be processed in each of the processing containers, or a film forming gas for forming a film on a substrate to be processed in each of the processing containers.

5. The processing method of claim 4, wherein the processing gas is the cleaning gas,
a plasma forming unit is arranged on a downstream side of the gas supply source to convert the processing gas into plasma, and
the simultaneously supplying of the processing gas and the individually supplying of the processing gas include supplying the processing gas converted into plasma by the plasma forming unit.

6. The processing method of claim 4, wherein the processing gas is the cleaning gas or the etching gas, and
the method further comprises:
measuring an amount of a specific component contained in a gas discharged from each of the processing containers when a processing corresponding to the processing gas is performed; and
detecting a timing at which the simultaneously supplying of the processing gas is switched to the individually supplying of the processing gas or a timing at which the individually supplying of the processing gas is ended, by using the measured amount of the specific component.

7. The processing method of claim 4, wherein the processing gas is the film forming gas, and
the method further comprises:
measuring a film thickness of a film formed on a substrate to be processed in each of the processing containers when a processing corresponding to the processing gas is performed; and
detecting a timing at which the simultaneously supplying of the processing gas is switched to the individually supplying of the processing gas or a timing at which the individually supplying of the processing gas is ended, by using the measured film thickness.

8. The processing method of claim 1, the plurality of processing containers are stacked and arranged in a vertical direction.

9. A processing apparatus comprising:
a gas supply source configured to supply a processing gas;
a plurality of processing containers connected to the gas supply source and configured to perform a processing corresponding to the processing gas, at least some of the processing containers having different lengths of pipes to the gas supply source; and
a controller configured to execute a processing method including simultaneously supplying the processing gas from the gas supply source to the plurality of processing containers, and individually supplying the processing gas from the gas supply source to the plurality of processing containers or to some of the plurality of processing containers.

* * * * *